(12) United States Patent
Christiansen et al.

(10) Patent No.: US 10,595,441 B1
(45) Date of Patent: Mar. 17, 2020

(54) METHOD AND APPARATUS FOR SEPARATING A THERMAL LOAD PATH FROM A STRUCTURAL LOAD PATH IN A CIRCUIT BOARD ENVIRONMENT

(71) Applicants: Martin Brokner Christiansen, Laurel, MD (US); Steven Ward Van Sciver, Easton, PA (US)

(72) Inventors: Martin Brokner Christiansen, Laurel, MD (US); Steven Ward Van Sciver, Easton, PA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/374,168

(22) Filed: Apr. 3, 2019

(51) Int. Cl.
  *H05K 7/20* (2006.01)
  *H05K 7/14* (2006.01)
  *H05K 1/02* (2006.01)

(52) U.S. Cl.
  CPC ........... *H05K 7/205* (2013.01); *H05K 1/0213* (2013.01)

(58) Field of Classification Search
  CPC ...... H05K 7/205; H05K 1/0213; H05K 7/209; H05K 7/20854; H05K 1/0203;
  (Continued)

(56) References Cited

U.S. PATENT DOCUMENTS

| | | | |
|---|---|---|---|
| 2,036,432 A | 12/1933 | Musante et al. | |
| 4,846,095 A | 7/1989 | Emslander | |

(Continued)

FOREIGN PATENT DOCUMENTS

| | | |
|---|---|---|
| DE | 10138711 A1 | 4/2002 |
| EP | 2400828 A1 | 12/2011 |

(Continued)

OTHER PUBLICATIONS

Kawai, J et al.: "Fabrication of Superconducting Quantum Interference Device Magnetometers on a Glass Epoxy Polyimide Resin Substrate With Copper Terminals," Physics Procedia, NL, 2012, vol. 36, pp. 262-267.

(Continued)

*Primary Examiner* — Jayprakash N Gandhi
*Assistant Examiner* — Michael A Matey
(74) *Attorney, Agent, or Firm* — Tarolli, Sundheim, Covell & Tummino LLP

(57) ABSTRACT

A heat sink includes a plurality of apertures extending therethrough. The heat sink is arranged substantially parallel to a circuit board and includes at least one aperture transversely aligned with a corresponding IC chip of the circuit board. An underside of the heat sink is structurally connected to the circuit board. A plurality of thermal bridges is provided. Each thermal bridge includes a center bridge pad and at least one footer pad, connected via at least one offset wire. Each thermal bridge is aligned with a corresponding aperture. An underside of each footer pad is attached to the heat sink, with the offset wire extending into the corresponding aperture to suspend the center bridge pad at least partially into the aperture above the IC chip, thus creating a thermal load path. The apparatus separates a thermal load path from a structural load path in a circuit board environment.

17 Claims, 13 Drawing Sheets

(58) Field of Classification Search
CPC ... H05K 2201/066; H05K 2201/10272; H05K 2201/10393; H05K 2201/10416; H05K 7/1424; H05K 7/20963; G06F 1/20

See application file for complete search history.

(56) References Cited

U.S. PATENT DOCUMENTS

| | | | |
|---|---|---|---|
| 4,962,444 A | | 10/1990 | Niggemann |
| 5,268,815 A | * | 12/1993 | Cipolla ................ H01L 25/105 165/80.3 |
| 6,285,564 B1 | | 9/2001 | O'Brien |
| 6,616,469 B2 | | 9/2003 | Goodwin et al. |
| 6,713,854 B1 | * | 3/2004 | Kledzik ................ H05K 1/141 174/252 |
| 6,957,623 B2 | | 10/2005 | Guisinger et al. |
| 7,190,060 B1 | * | 3/2007 | Chiang ............. H01L 23/49555 257/673 |
| 7,348,932 B1 | * | 3/2008 | Puzella ............. H01Q 21/0025 342/373 |
| 7,432,790 B2 | | 10/2008 | Arndt et al. |
| 7,609,523 B1 | * | 10/2009 | Ni ...................... H01L 23/3672 257/707 |
| 8,306,772 B2 | | 11/2012 | Cox et al. |
| 8,694,939 B1 | | 4/2014 | Frost et al. |
| 8,780,556 B1 | | 7/2014 | Ditri |
| 9,648,749 B1 | | 5/2017 | Christiansen |
| 2002/0187590 A1 | * | 12/2002 | Bolken .................. H01L 21/56 438/122 |
| 2004/0041166 A1 | * | 3/2004 | Morrison .......... H01L 23/49827 257/117 |
| 2005/0061541 A1 | | 3/2005 | Belady |
| 2008/0032456 A1 | * | 2/2008 | Ahn ..................... H01L 23/13 438/124 |
| 2008/0239683 A1 | * | 10/2008 | Brodsky ............. H05K 7/1069 361/760 |
| 2011/0075377 A1 | * | 3/2011 | Paquette ............ H05K 7/20509 361/709 |
| 2012/0140421 A1 | * | 6/2012 | Kirstine ............. H05K 7/20509 361/722 |
| 2013/0333414 A1 | | 12/2013 | Inaba et al. |
| 2014/0268594 A1 | * | 9/2014 | Wang .................... H05K 1/183 361/749 |
| 2014/0293533 A1 | * | 10/2014 | Doering .................... G06F 1/20 361/679.54 |
| 2016/0073548 A1 | | 3/2016 | Wei et al. |
| 2017/0142820 A1 | * | 5/2017 | Christiansen ...... H05K 7/20372 |
| 2017/0164459 A1 | * | 6/2017 | Kim ..................... H05K 1/0203 |
| 2018/0196196 A1 | * | 7/2018 | Byrd .................... G02B 6/1225 |

FOREIGN PATENT DOCUMENTS

| | | |
|---|---|---|
| JP | S6549169 A | 3/1989 |
| JP | 7-7188 A | 1/1995 |
| JP | 07007188 A | 1/1995 |
| JP | 2007049015 A | 2/2007 |
| JP | 2010186846 A | 8/2010 |

OTHER PUBLICATIONS

Japanese Office Action corresponding to Japanese Application No. 2018-525559 dated Apr. 8, 2019.

Gubin, et al.: "Dependence of magnetic penetration depth on the thickness of superconducting Nb thin films"; found on the internet @ http://zb0035.zb.kfa-juelich.de/record/47039/files/74153.pdf; The American Physical Society, Physical Review B 72, 06453 (2005); pp. 1-8.

Locment, et al.: "DC Load and Batteries Control Limitations for Photovoltaic Systems. Experimental Validation"; found on the internet @ http://www.pgembeddedsystems.com/securelogin/upload/project/IEEE/15/PG2012PE1 /dcload_ and_ batteries_ control_ limitations for _photovoltaic_ systems_experimental_validation.pdf; IEEE Transactions on Power Electronics, vol. 27, No. 9, Sep. 2012, pp. 4030-4038.

Tolpygo, et al.: "Fabrication Process and Properties of Fully-Planarized Deep-Submicron Nb/Al—AlOx/Nb Josephson Junctions for VLSI Circuits"; found on the internet@ https://~rxiv.org/flp/arxiv/papers/1408/1408.5829.pdf; 2EPo1A-02 DOI: 10.1109/TASC. 2014.2374836; pp. 1-13.

Iversen A ED—Institute of Electrical and Electronics Engineers: "Next Generation Power Electronics for Space and Aircraft. / Part II—Packaging", Aerospace Power Systems. Boston, Aug. 4-9, 1991; [Proceedings of the Intersociety Energy Conversion Engineering Conference], New York, IEEE, US, vol. 1, Aug. 4, 1991 (Aug. 4, 1991), pp. 177-182, XP000280446, ISBN: 978-0-89448-163-5, p. 179, col. 2, p. 181, cols. 1-2, figures 6-8.

International Search Report and Written Opinion for PCT/US2019/024857 dated Jul. 22, 2019.

Japanese Office Action corresponding to JP Patent No. 2018-525552, pp. 1-3, dated May 29, 2019.

International Search Report and Written Opinion corresponding to PCT/US2019/024366, pp. 1-15, dated Jul. 4, 2019.

Korean Office Action corresponding to Korean Patent Application No. 10-2018-7013967, pp. 1-6, dated Jun. 24, 2019.

International Search Report and Written Opinion corresponding to PCT/US2019/018766, pp. 1-16, dated May 22, 2019.

Jun Kawai, "Fabrication of superconducting quantum interference device magnetometers on a glass epoxy polyimide resin substrate with copper terminals", Physics Procedia, vol. 36, p. 262-267, 2012.

International Search Report for international Application No. PCT/US2019/044379 dated Dec. 3, 2019.

Korean Office Action for Application No. 10-2018-7013698 dated Oct. 16, 2019.

* cited by examiner

US 10,595,441 B1

METHOD AND APPARATUS FOR SEPARATING A THERMAL LOAD PATH FROM A STRUCTURAL LOAD PATH IN A CIRCUIT BOARD ENVIRONMENT

TECHNICAL FIELD

This disclosure relates to an apparatus and method for a circuit board architecture and, more particularly, to a method and apparatus for separating a thermal load path from a structural load path in a circuit board environment.

BACKGROUND

Certain circuit board architectures, such as for specialty cryogenic use environments, are designed to achieve desired thermal and structural load paths. In some example circuit board architectures, the spatial and/or heat-transfer tolerances in the circuit board environment (including an accompanying heat sink) can be quite constrained.

SUMMARY

In an embodiment, an apparatus is described. A substantially planar heat sink includes a plurality of apertures extending therethrough. The heat sink is arranged substantially parallel to a substantially planar circuit board. The heat sink includes at least one aperture transversely aligned with a corresponding IC chip of the circuit board. The IC chip is structurally supported by a first surface of the circuit board. An underside of the heat sink is structurally connected to the first surface of the circuit board. A plurality of thermal bridges is provided. Each thermal bridge includes a center bridge pad and at least one footer pad transversely offset from the center bridge pad. The center bridge pad and each footer pad are connected via at least one offset wire. Each thermal bridge is aligned with a corresponding aperture. An underside of each footer pad is attached to the heat sink adjacent to a corresponding aperture, with the offset wire extending into the corresponding aperture to suspend the center bridge pad at least partially into the aperture above the IC chip, thus creating a thermal load path from the IC chip to the center bridge pad, from the center bridge pad through the offset wire to the footer pad, and from an underside of the footer pad to an upper side of the heat sink. The apparatus is configured to separate a thermal load path from a structural load path in a circuit board environment.

In an embodiment, a method for separating a thermal load path from a structural load path in a circuit board environment is provided. A substantially planar circuit board includes a plurality of IC chips attached to a first surface thereof. A substantially planar heat sink includes a plurality of apertures extending therethrough. The heat sink is arranged substantially parallel to the circuit board with at least one aperture transversely aligned with a corresponding IC chip of the circuit board. An underside of the heat sink is structurally connected to the first surface of the circuit board. A plurality of thermal bridges is provided. Each thermal bridge includes a center bridge pad and at least one footer pad transversely offset from the center bridge pad. The center bridge pad and each footer pad are connected via at least one offset wire. Each thermal bridge is aligned with a corresponding aperture. An underside of each footer pad is attached to the heat sink adjacent to a corresponding aperture. The offset wire is extended into the corresponding aperture to suspend the center bridge pad at least partially into the aperture above the IC chip. A thermal load path is created from the IC chip to the center bridge pad, from the center bridge pad through the offset wire to the footer pad, and from an underside of the footer pad to an upper side of the heat sink.

In an embodiment, a circuit board system is described. At least one substantially planar circuit board includes a plurality of IC chips attached to a first surface thereof. A chassis includes a plurality of mutually parallel board-accepting slots arranged in a transverse stack. At least one apparatus includes a substantially planar heat sink including a plurality of apertures extending therethrough. The heat sink is arranged substantially parallel to the circuit board with at least one aperture transversely aligned with a corresponding IC chip of the circuit board and an underside of the heat sink being structurally connected to the first surface of the circuit board. A plurality of thermal bridges is provided. Each thermal bridge includes a center bridge pad and at least one footer pad transversely offset from the center bridge pad. The center bridge pad and each footer pad are connected via at least one offset wire. Each thermal bridge is aligned with a corresponding aperture. An underside of each footer pad is attached to the heat sink adjacent to a corresponding aperture, with the offset wire extending into the corresponding aperture to suspend the center bridge pad at least partially into the aperture above the IC chip, thus creating a thermal load path from the IC chip to the center bridge pad, from the center bridge pad through the offset wire to the footer pad, and from an underside of the footer pad to an upper side of the heat sink. Each circuit board and corresponding apparatus are associated with a selected board-accepting slot. The thermal load path is separated from the structural load path of the system.

BRIEF DESCRIPTION OF THE DRAWINGS

For a better understanding, reference may be made to the accompanying drawings, in which.

DESCRIPTION OF ASPECTS OF THE DISCLOSURE

This technology comprises, consists of, or consists essentially of the following features, in any combination.

Figure 1:
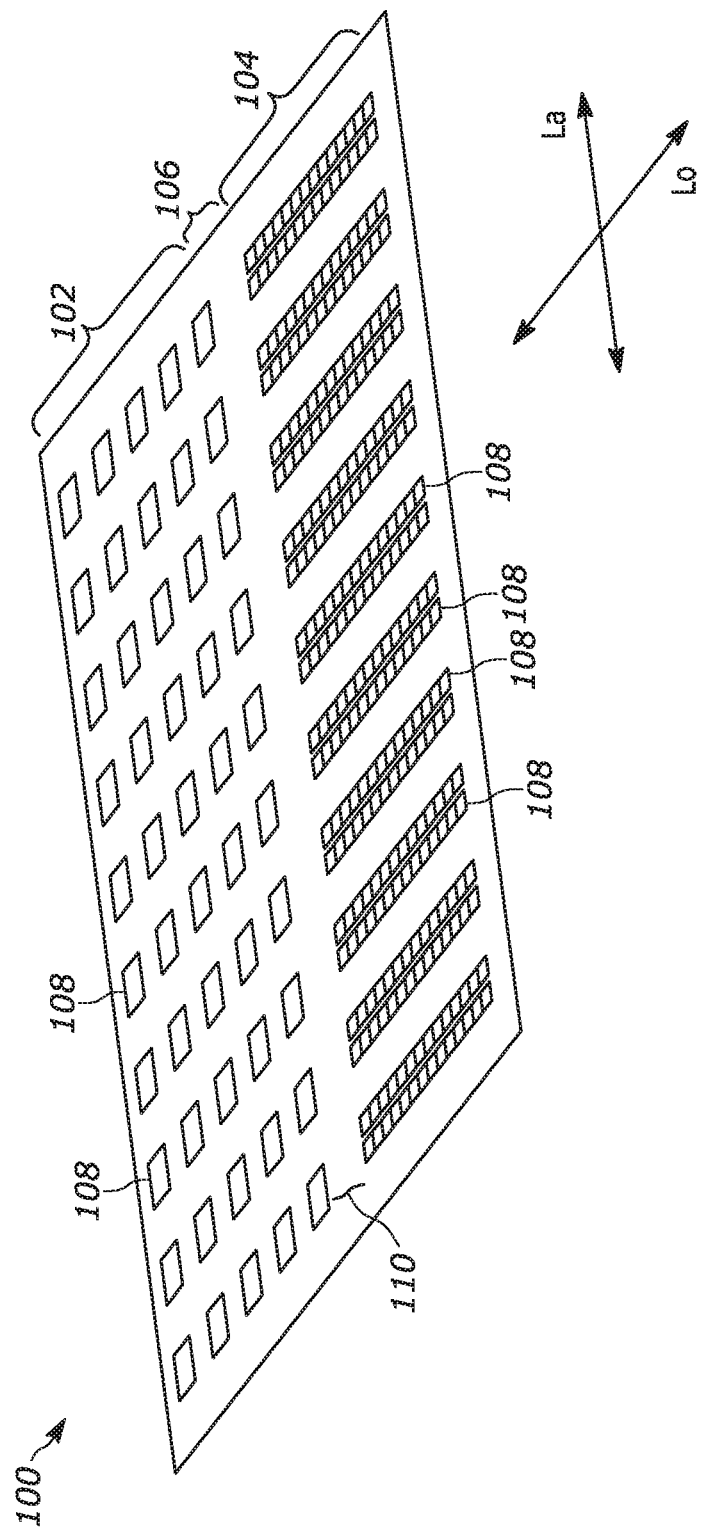
FIG. 1 is a top perspective view of an example circuit board use environment.

FIG. 1 depicts a prior art circuit board 100. Each circuit board 100 includes first and second longitudinally spaced circuit board subassemblies 102 and 104, respectively. The "longitudinal" direction is substantially parallel to line "Lo", and the "lateral" direction is substantially parallel to arrow "La" in FIG. 1, thus making the lateral-longitudinal plane (which contains both line Lo and line La) slightly canted from the plane of the page, and substantially coincident with the "plane" of the circuit board 100 itself. One of ordinary skill in the art will be able to carry this orientation scheme through the remaining Figures.

The first and second circuit board subassemblies 102 and 104 are connected together by a longitudinally extending card connector 106, for transmission of electrical power and/or signals therebetween. As shown in FIG. 1, each circuit board subassembly 102 and 104 includes a plurality of IC chips 108 extending transversely from a single backing substrate 110, such as from a top surface of the backing substrate 110, as shown. The "transverse" direction, as used herein, is substantially perpendicular to both the longitudinal and lateral directions. (Various circuit traces, power and/or signal wires, and the like may also be associated with the circuit board 100 but are omitted from the Figures for clarity.) The IC chips 108 of a single circuit board 100 may have different temperature requirements. For example, the longitudinally topmost (in the orientation of FIG. 1) array of IC chips 108 (e.g., those on the first circuit board subassembly 102) could have a desired operating temperature in the range of about 2-6K, such as about 4K. Similarly, the longitudinally bottommost (in the orientation of FIG. 1) array of IC chips 108 (e.g., those on the second circuit board subassembly 104) could have a desired operating temperature in the range of about 75-79K, such as about 77K.

Figure 2:
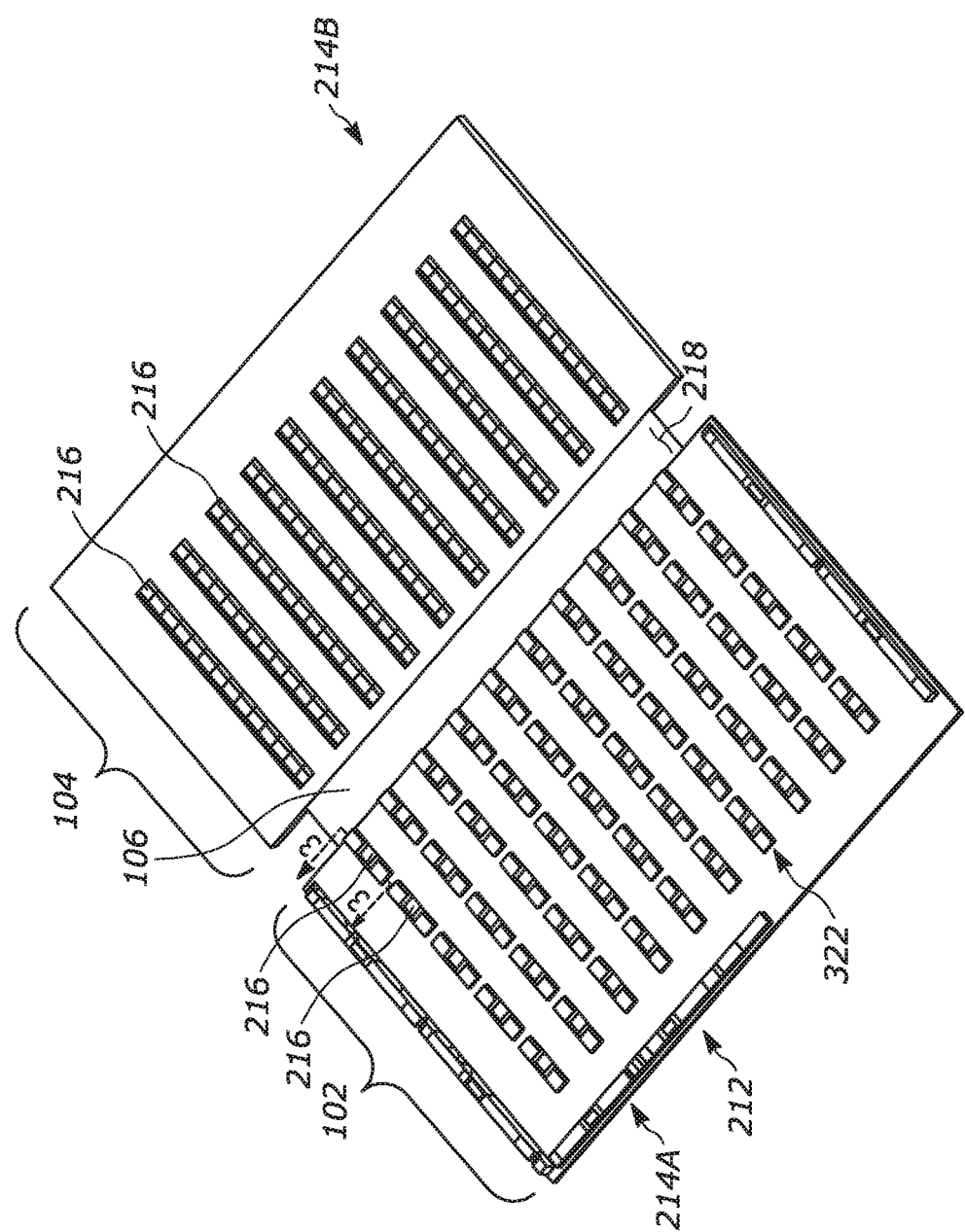
FIG. 2 is a partial top view of an example implementation of the invention.

As shown in FIG. 2, an apparatus 212 for separating a thermal load path from a structural load path in a circuit board 100 environment includes a substantially planar heat sink 214 including a plurality of apertures 216 extending therethrough. As shown in FIG. 2, a plurality of heat sinks (indicated here as 214A and 214B) could be associated with a single circuit board 100.

The heat sink 214 is arranged substantially parallel to a substantially planar circuit board 100 as shown in the Figures, though it is contemplated that the heat sink 214 and circuit board 100 could instead have any suitable non-planar configuration or profile. For most use environments, though, the heat sink 214 and circuit board 100 should have mimicking or mating profiles to allow the heat sink 214 to fit closely into a nesting configuration with the circuit board 100.

Figure 3:
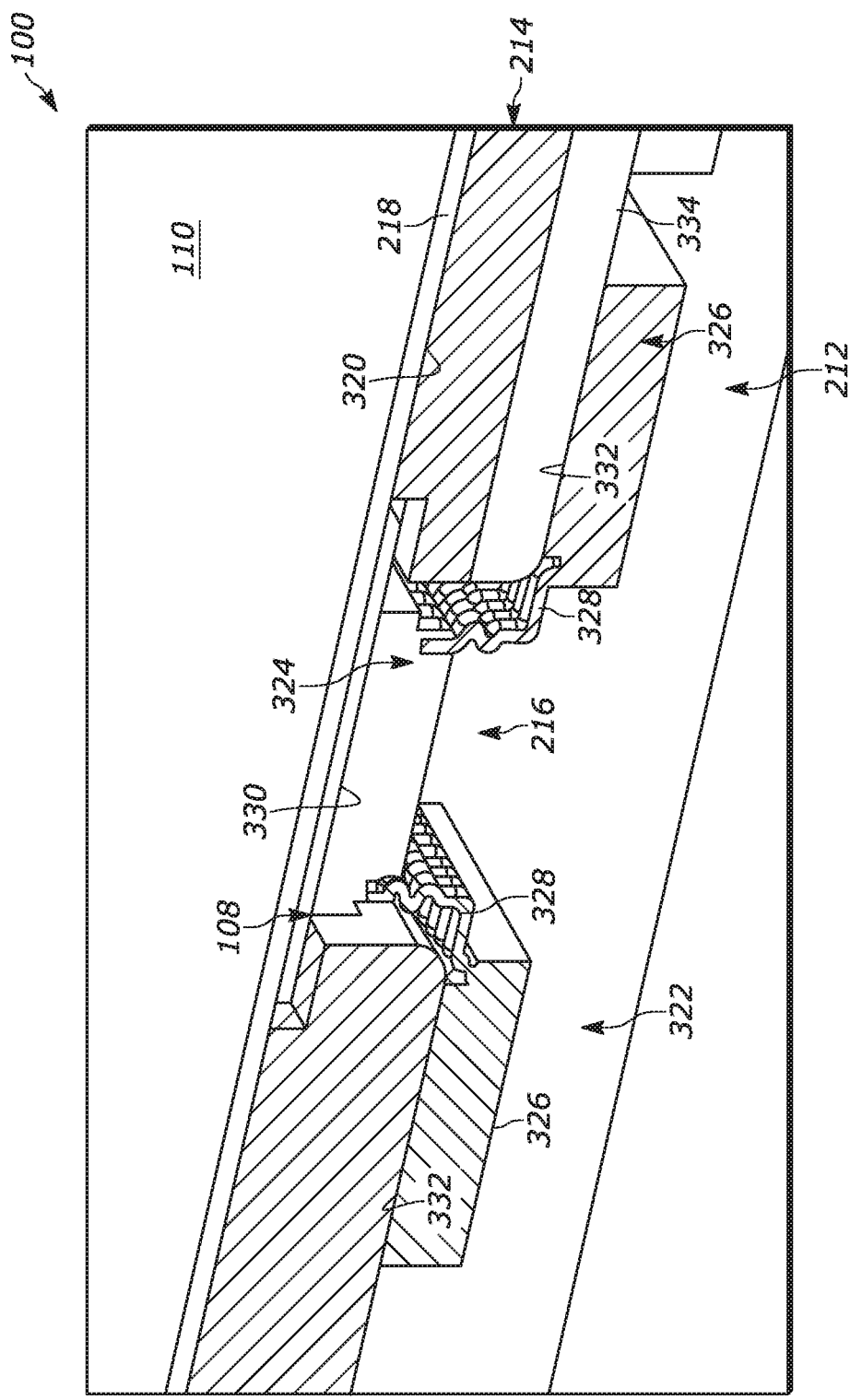
FIG. 3 is a cross-sectional view taken along line 3-3 of FIG. 2.

The heat sink 214 includes at least one aperture 216 transversely aligned with a corresponding IC chip 108 of the circuit board 100. The IC chip 108 is structurally supported by a first surface (e.g., top surface 218) of the circuit board 100. An underside 320 of the heat sink 214, as shown in FIG. 3, is structurally connected to the first surface 218 of the circuit board 100 in any suitable manner. The apertures 216 may be configured to contact the lateral and/or longitudinal sides of the corresponding IC chips 108, or may be designed slightly offset or larger than the IC chips 108 for any reason(s), such as ease of assembly and/or to facilitate thermal expansion/contraction within the apparatus 212 once installed. Though the apparatus 212 will often be placed under vacuum in use, it is also contemplated that such a gap between the apertures 216 and IC chips 108 may facilitate convection in non-vacuum use environments.

With reference again to FIG. 3, the apparatus 212 also includes a plurality of thermal bridges 322. Each thermal bridge 322 includes a center bridge pad 324 and at least one footer pad 326 transversely offset from the center bridge pad 324. The center bridge pad 324 and each footer pad 326 are mutually structurally and/or thermally connected via at least one offset wire 328. Each thermal bridge 322 is aligned with a corresponding aperture 216. As shown in the Figures, each thermal bridge 322 may include a center bridge pad 324 interposed between two linearly spaced aligned footer pads 326. Also as shown in the Figures, a plurality of offset wires 328 may connect each footer pad 326 to the center bridge pad 324. The offset wire(s) 328 may have a labyrinthine configuration, such as that shown in the Figures.

The offset wire 328 may be configured to mechanically dissipate thermal expansion dimensional mismatches between at least two of the circuit board 100, the IC chip 108, the thermal bridge 322, and the heat sink 214, during startup, use, and/or shutdown of the circuit board 100. Stated differently, the offset wire 328 may be configured with an expansion zone (e.g., the labyrinthine configuration shown in the Figures) which absorbs mechanical artifacts of CTE (coefficient of thermal expansion) mismatches between two or more other structures of the apparatus 212 and/or circuit board 100, such as by flexing or changing profile. It is also contemplated that the offset wire 328 may assist with loosely "pulling" the backing substrate 110 toward the heat sink 214 to allow some amount of "sliding" therebetween (i.e., relative movement within the lateral-longitudinal plane). CTE mismatches may occur, for example, due to the CTE of the materials desired for thermal performance (e.g., high RRR copper, 5N5 aluminum, and others) of the heat sink 214 having a CTE more than thirteen times higher than the CTE of the materials making up the backing substrate 110 and IC chips 108.

For example, metals having high cryogenic conductivity may be desirable in forming at least a portion of the heat sink 214 in some use environments. ASTM/UNS C10100 copper is the commercial designation for Oxygen Free High Conductivity (OFHC) copper that has a better Residual Resistivity Ratio (RRR) than other available coppers. Further heat treatments can be used to enhance the RRR and further improve the thermal conductivity at cryogenic temperatures, including performance of 2400 W/mK at 20 K instead of the 400 seen at 273 K. The 5N5 aluminum is 0.999995% pure, which may also facilitate high thermal conductivity (30000 W/mK at 8 K) instead of typical aluminum (236 W/mK at 273 K). Some examples of suitable materials for the backing substrate 110 currently include silicon and glass, with lithography techniques being used to fabricate superconducting connections. Other suitable radiofrequency materials for the backing substrate 110 include, but are not limited to, RT/duroid® laminates (and other, similar products, all available from Rogers Corporation of Chandler, Ariz.), ceramics (including the ceramic packages offered for known silicon devices), and other known and yet-to-be-discovered printed wiring board materials, for use with conductors at least partially made from copper or any other material.

Concurrently, an underside 332 of each footer pad 326 may be attached to the heat sink 214 adjacent to a corresponding aperture 216. The offset wire 328 may extend into the corresponding aperture 216, as shown in FIG. 3, to suspend the center bridge pad 324 at least partially into the aperture 216 above the IC chip 108. Thus, a thermal load path can be created from the IC chip 108 to the center bridge pad 324, from the center bridge pad 324 through the offset wire 328 to the footer pad 326, and from an underside 332 of the footer pad 326 to an upper side 334 of the heat sink 214. As shown in FIG. 3, an underside 330 of the center bridge pad 324 may be in direct contact with a corresponding IC chip 108, in order to aid thermal transfer away from that IC chip 108. Indeed, any of the components shown and/or described herein may be in thermal and/or structural contact with one another, directly and/or indirectly (i.e., with another structure interposed on the structural/thermal path therebetween), and may have any (or no) temporary or permanent attachment established therebetween, as desired by one of ordinary skill in the art for a particular use environment.

In this way, the apparatus 212 may be configured to separate a thermal load path from a structural load path in a circuit board 100 environment, through the use of at least the thermal bridge 332 as a thermosiphon structure. Stated differently, in a conventional heat sink use application, the heat sink is directly attached (e.g., placed atop) the IC chips 108 in order to draw out and dissipate heat from the IC chips 108, and any CTE mismatch between parts of the assembly places mechanical stress on the heat sink to IC chip 108 interface in an undesirable manner. In contrast, the apparatus 212 shown and described herein facilitates direct mechanical attachment between the heat sink 214 and the backing substrate 110 without implicating the IC chips 108, and the thermal bridge 322 provides a thermal path for heat to be efficiently transferred from the IC chips 108 to the heat sink 214. The structural "load" of the heat sink 214 is carried by the backing substrate 110, and the heat sink 214 supports the thermal bridge 322, which is itself configured to absorb and/or dissipate unwanted structural forces from any source (including CTE mismatch) via at least the offset wires 328.

As depicted in FIG. 3, an entirety of the center bridge pad 324 may be recessed into the aperture 216, below the upper side 334 of the heat sink 214, for any reason(s), including (but not limited to) confirming assembly compliance and/or facilitating heat transfer. Alternatively, as desired, the thermal bridge 322 could be configured so that the center bridge pad 324 protrudes past the upper side 334 of the heat sink 214 when in contact with the underlying IC chip 108.

The components of the circuit board 100 and apparatus 212 may be made from any desired material or combination of materials for a particular use environment. For example, at least one of the heat sink 214, the footer pad 326, the center bridge pad 324, and the offset wire 328 may be at least partially made of copper.

Figure 4:
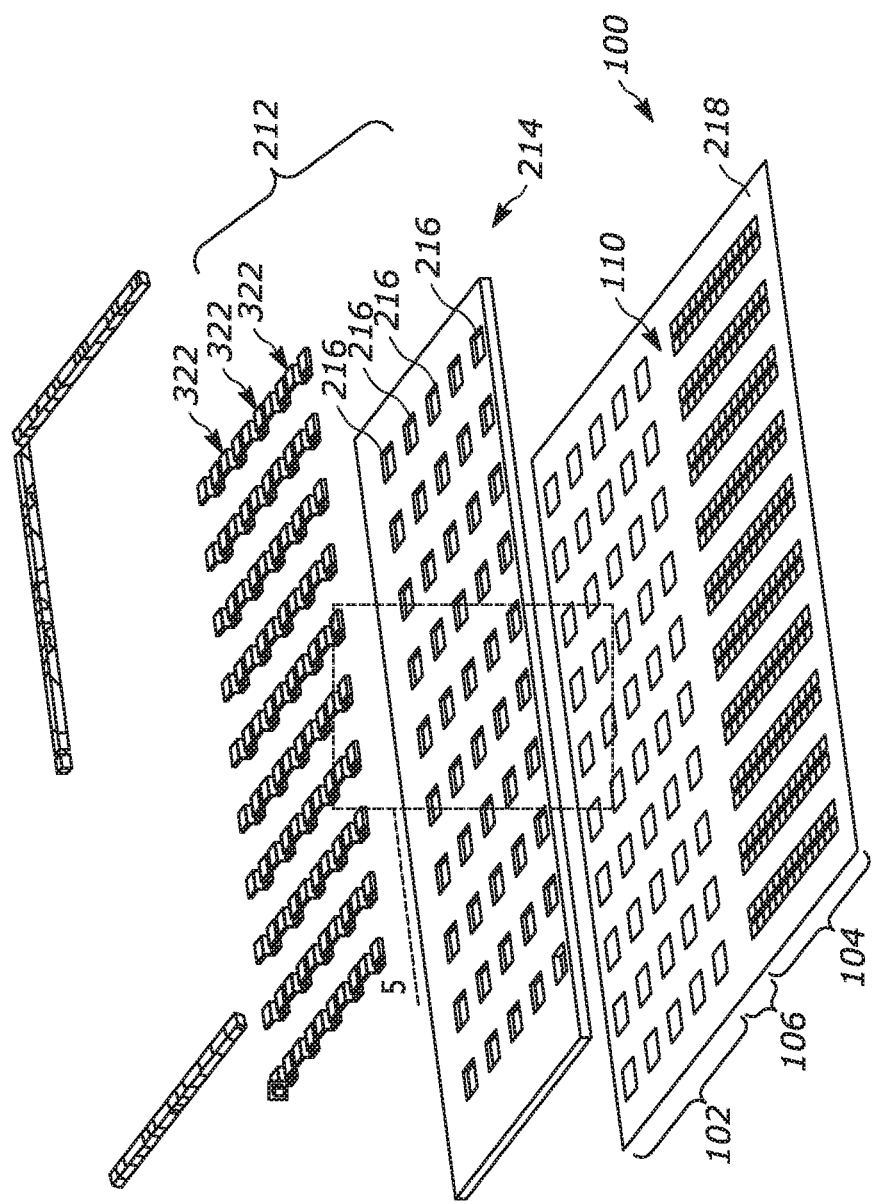
FIG. 4 is an exploded perspective view of the example implementation of FIG. 2.
Figure 5:
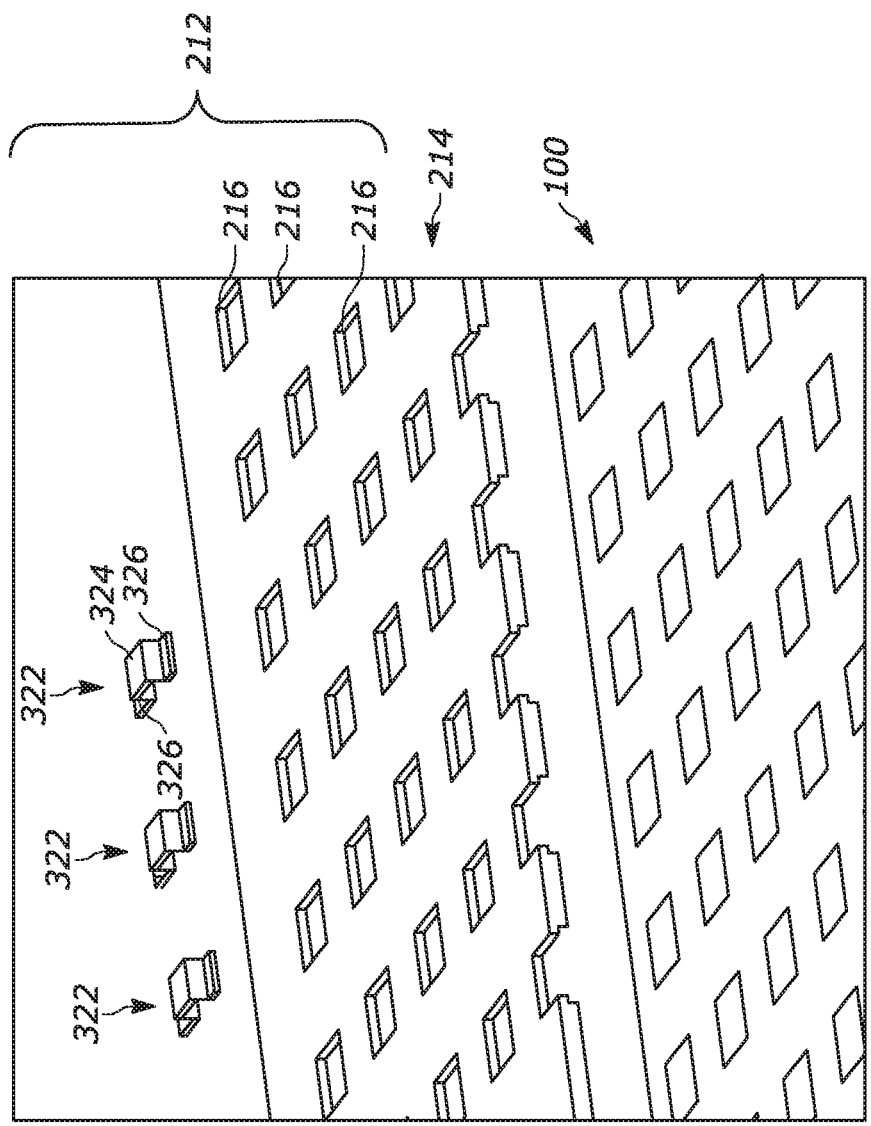
FIG. 5 is a detail view of area "5" of FIG. 4.
Figure 6:
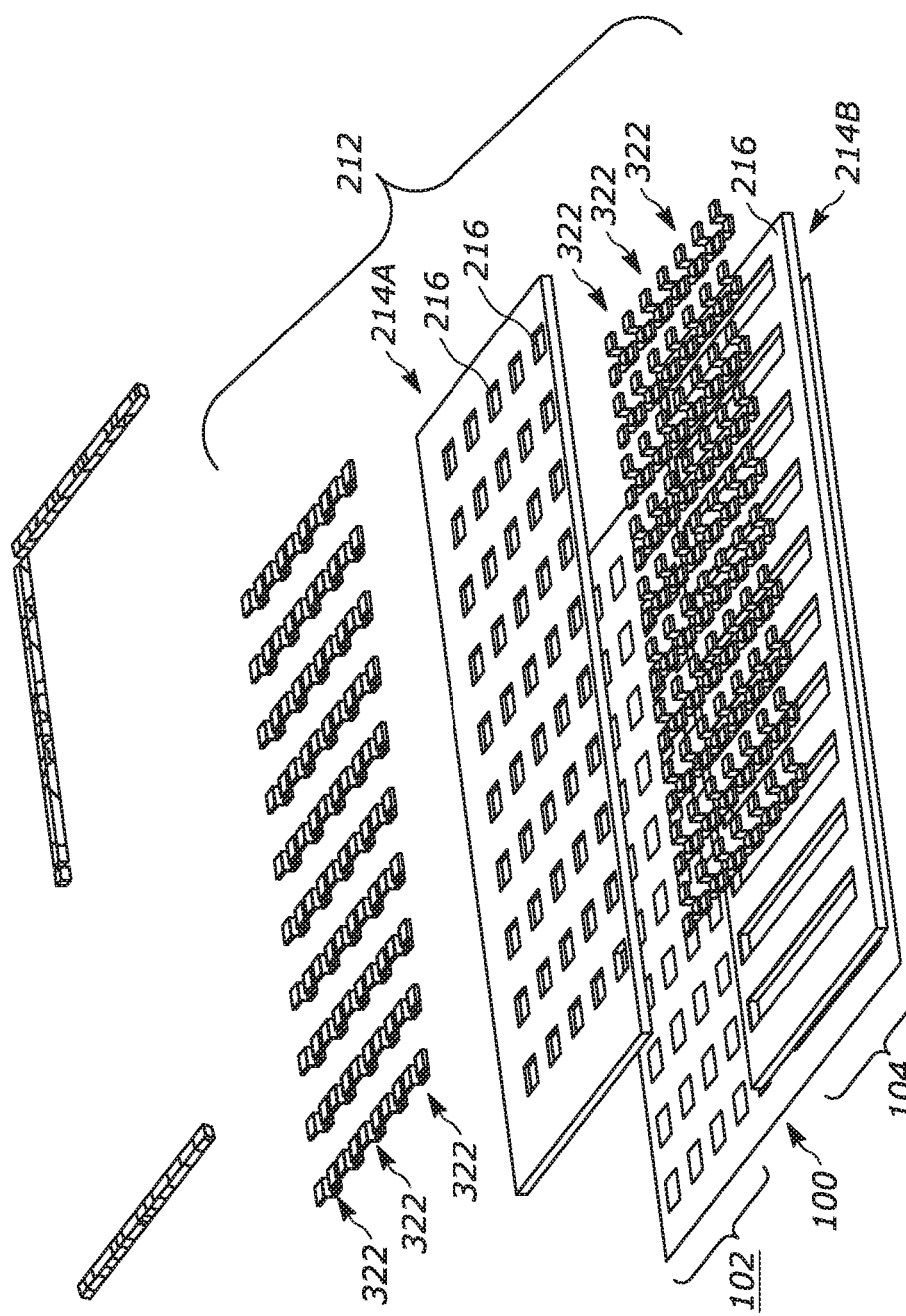
FIGS. 6-7 schematically depict a sequence of assembly of the example implementation of FIG. 2.

FIGS. 4-5 show an exploded view of a circuit board 100 and apparatus 212 for just the first circuit card subassembly 102. For example, in a cryocomputer, this might be the "cold" (~4K) side. The apparatus 212 can also or instead include provision for heat transfer for the second circuit card subassembly 104, which could be the "hot" (~77K) side of the cryocomputer. This arrangement is shown in FIG. 6, with a slightly differently configured heat sink 214B for the second circuit card subassembly 104, and either similar (as shown) or different thermal bridges 322, which could be provided by one of ordinary skill in the art for a particular use environment. The "hot" side portion of the apparatus 212 would function similarly to that described in detail above with reference to the "cold" side visual depictions in the Figures.

Figure 7:
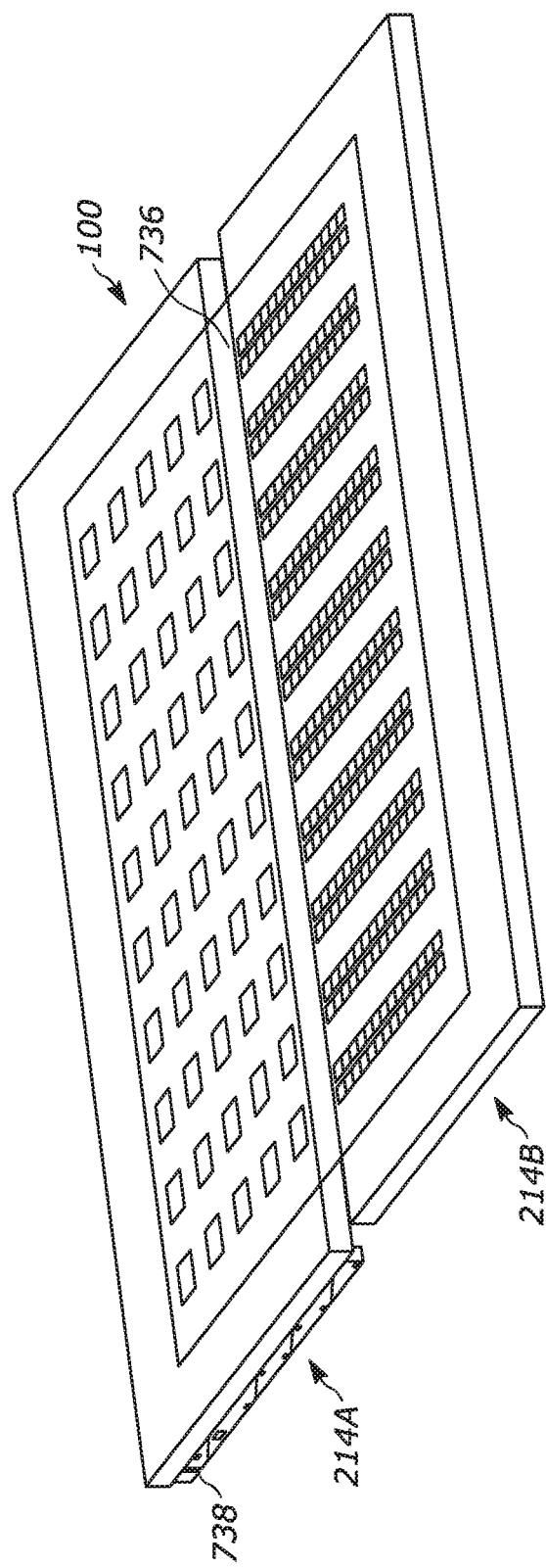
Figure 8:
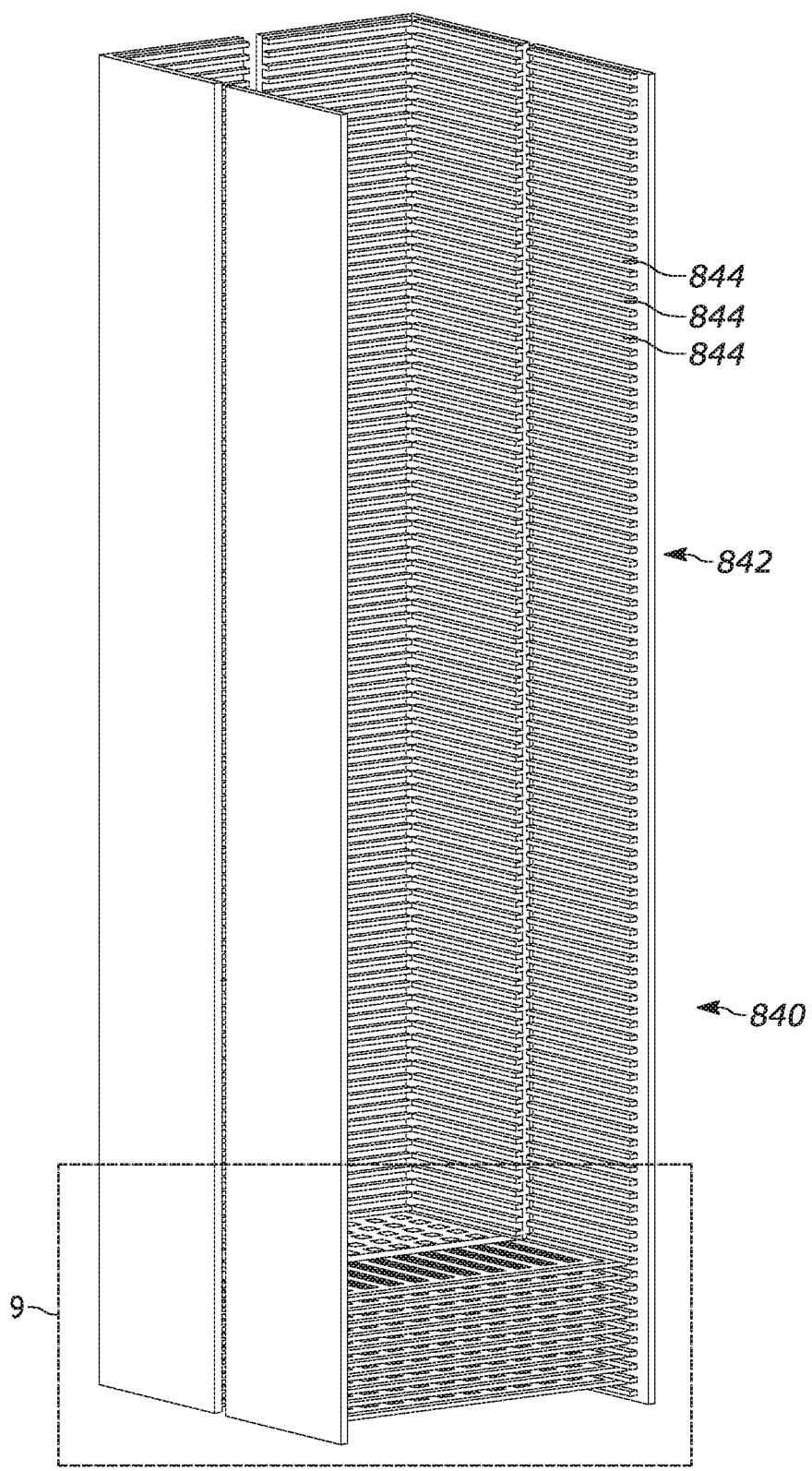
FIG. 8 is a front perspective view of an example chassis use environment for the example implementation of FIG. 2.
Figure 9:
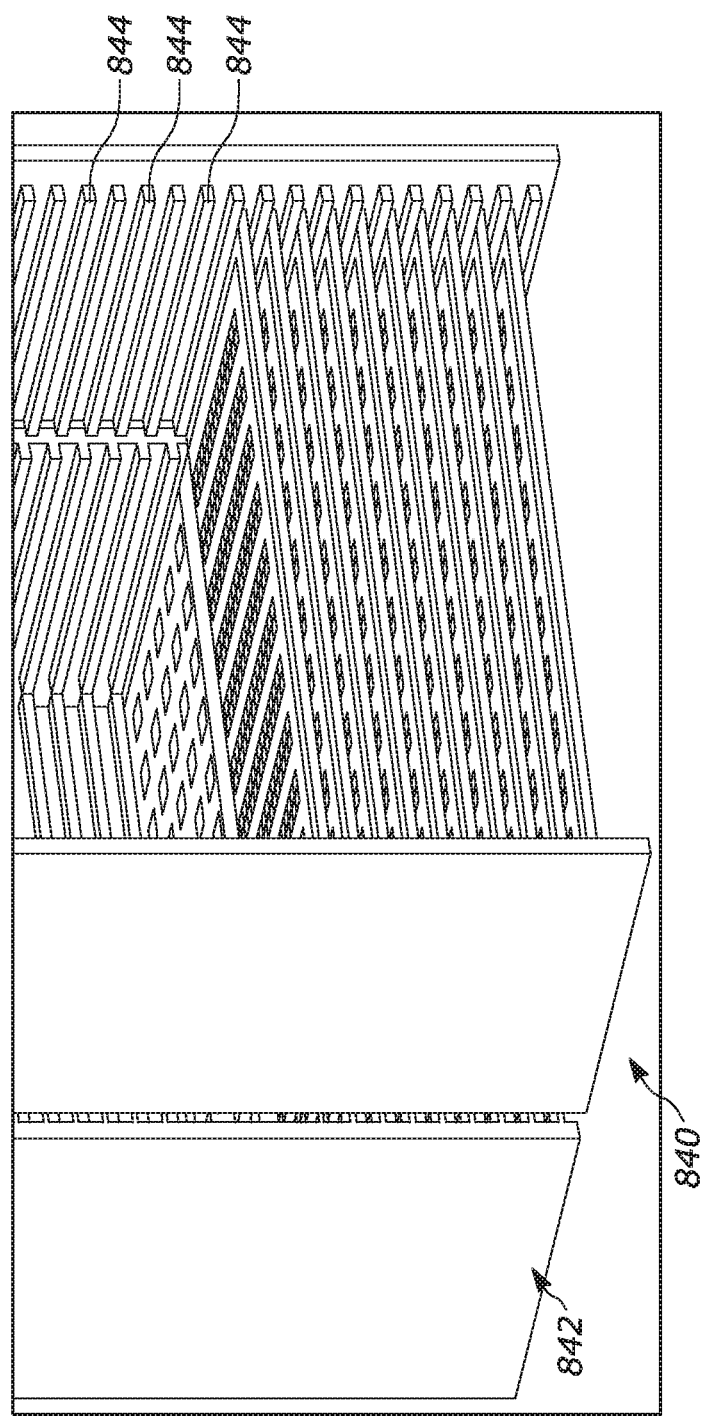
FIG. 9 is a detail view of area "9" of FIG. 8.

FIG. 7 shows an underside 736 of the circuit board 100. As shown, the heat sinks 214 could have a larger lateral-longitudinal plane footprint, in at least one dimension, than a corresponding first or second circuit card subassembly 102 or 104. FIG. 7 also shows an example wedge lock 738 which can be used to help create a circuit card system 840 as will now be discussed.

With reference now to FIGS. 8-12, a circuit board system 840 may include at least one substantially planar circuit board 100 including a plurality of IC chips 108 attached to a first surface 218 thereof, and an apparatus 100 as described with reference to FIGS. 1-7. The system can include a chassis 842 including a plurality of mutually parallel board-accepting slots 844 arranged in a transverse stack. Each circuit board 100 and corresponding apparatus 212 of the system 840 is associated with a selected board-accepting slot 844. Only a few slots 844 are shown in the Figures as including corresponding circuit boards 100 and apparatuses 212 for clarity, but any one or more (up to all) of the slots 844 can be "loaded" with corresponding circuit boards 100 and apparatuses 212 as desired for a particular use environment. The thermal load path is at least partially separated from the structural load path of the system 840, through use of the apparatus 212, as previously described.

Figure 10:
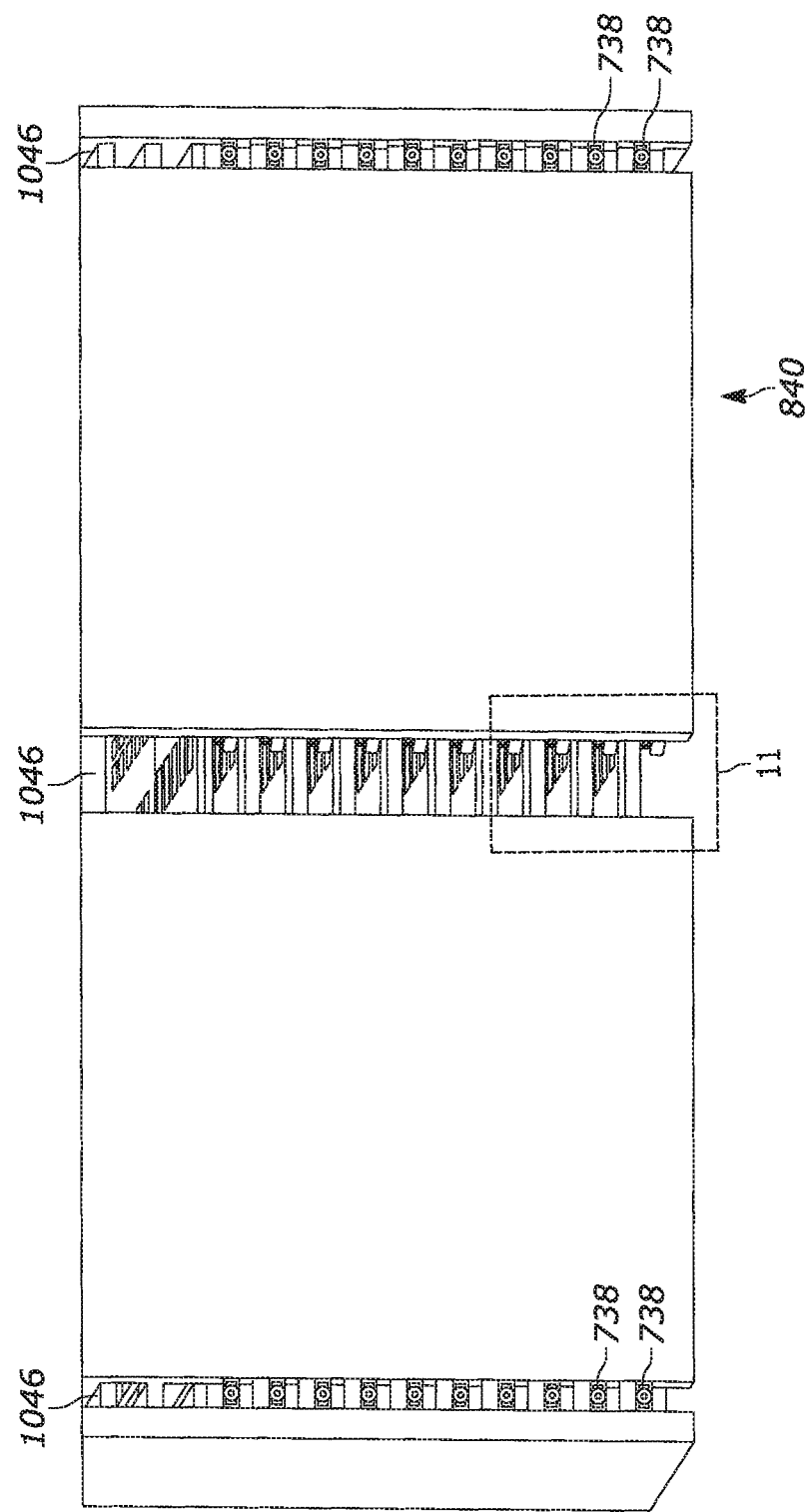
FIG. 10 is a rear view of the example chassis use environment of FIG. 8.
Figure 11:
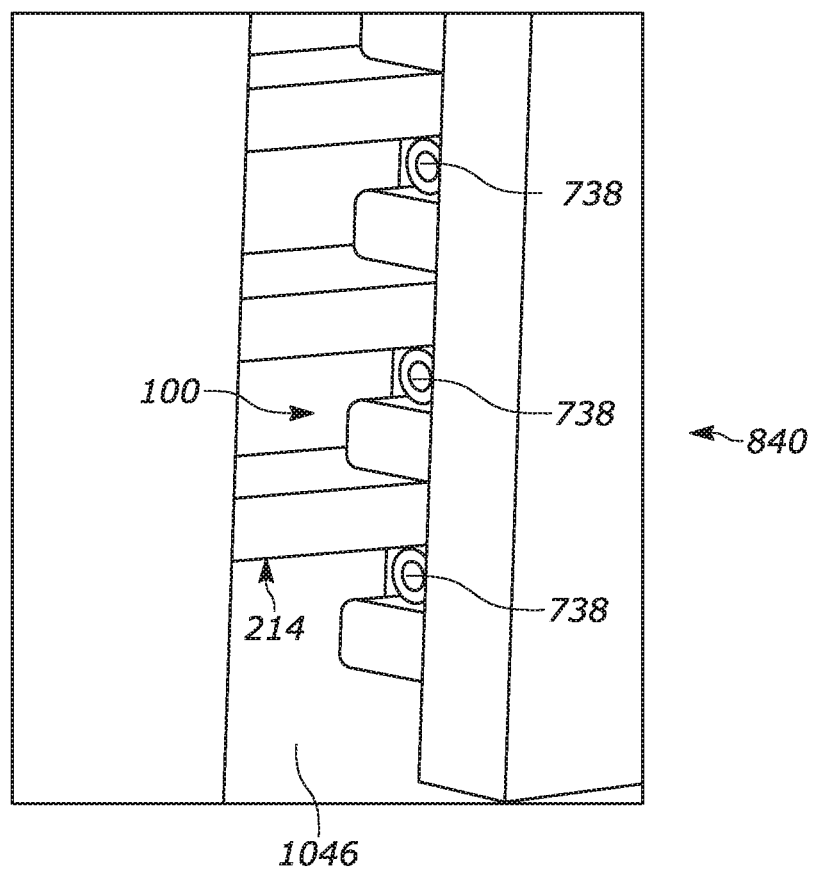
FIG. 11 is a detail view of area "11" of FIG. 10.

As shown in FIGS. 10-11, at least one wedge lock 738 may be interposed transversely between a selected board-accepting slot 844 and at least one of the circuit board 100 and corresponding apparatus 212. The wedge lock 738 may be of any desired type, and may be configured to transfer heat and/or mechanical force between the chassis 842 and the circuit board 100 and/or corresponding apparatus 212. The at least one wedge lock 738 may be in direct transverse contact with the board-accepting slot 844 and with a corresponding heat sink 214, or there may be one or more other structures interposed therebetween.

Again with reference to FIGS. 10-11, the chassis 842 may include at least one transversely extending access slot 1046 therein. Each access slot 1046, when present, allows access between at least one board-accepting slot 844 and an ambient space outside the chassis 842. Such through-access may be helpful, for example, in accessing the wedge locks 738 for installation and removal of the circuit boards 100 from the chassis 842.

Figure 12:
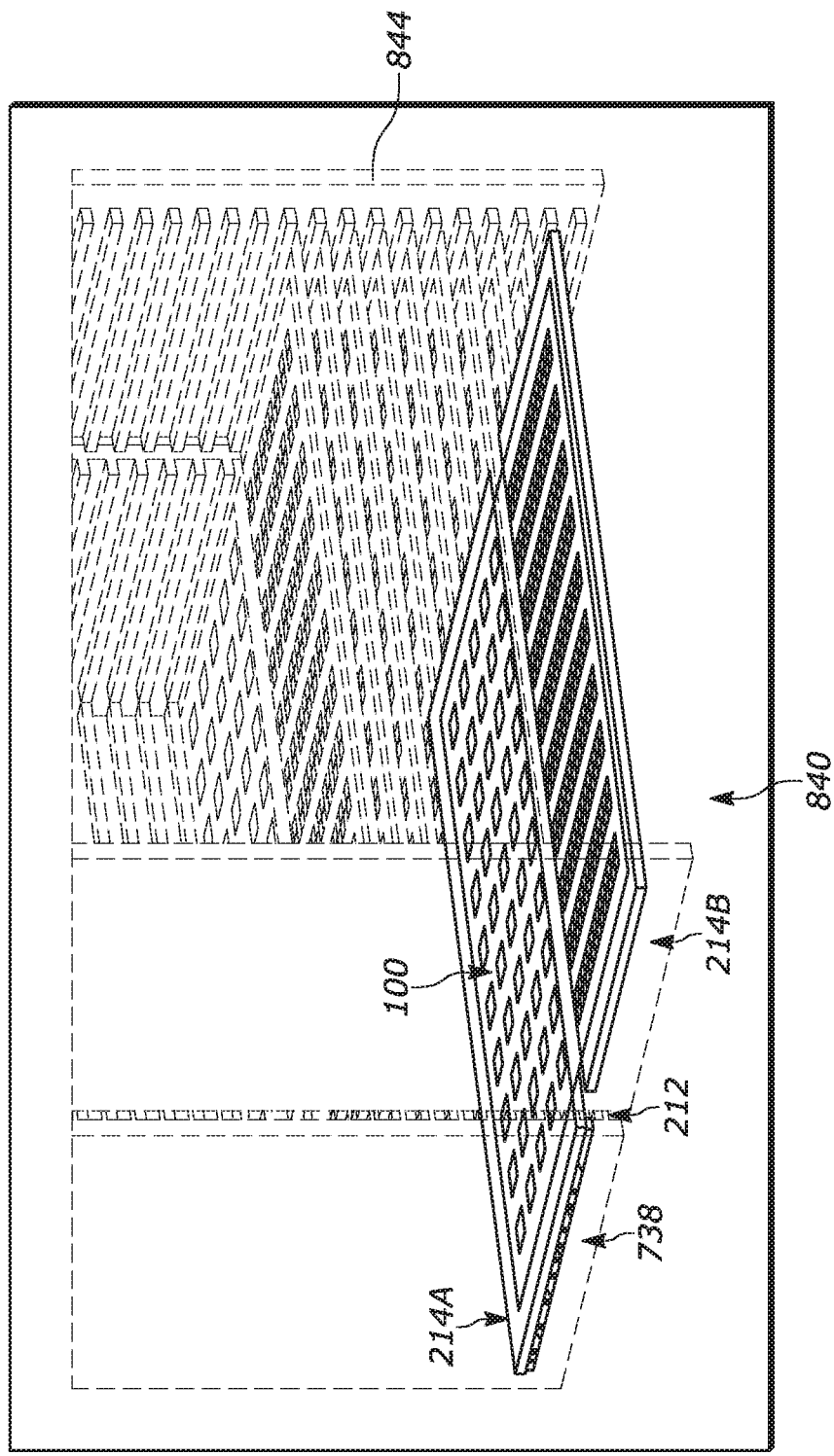
FIG. 12 is a partial-phantom view similar to FIG. 9.

FIG. 12 shows a phantom-line view of the chassis 842 and several of the circuit boards 100 and corresponding apparatuses 212, to depict how the circuit boards 100 are held "upside down" in the board-accepting slots 844. This optional "upside down" arrangement may be useful, for example, in load management by facilitating mechanical and/or thermal support of certain components of the apparatus 212 (e.g., the backing substrate 100) instead of suspending those components in the "rightside up" configuration. However, it is also contemplated that the circuit boards 100 and corresponding apparatuses 212 could be mounted in "mirrored pairs" within the chassis 842 to provide desired chip density, in some use environments.

Figure 13:
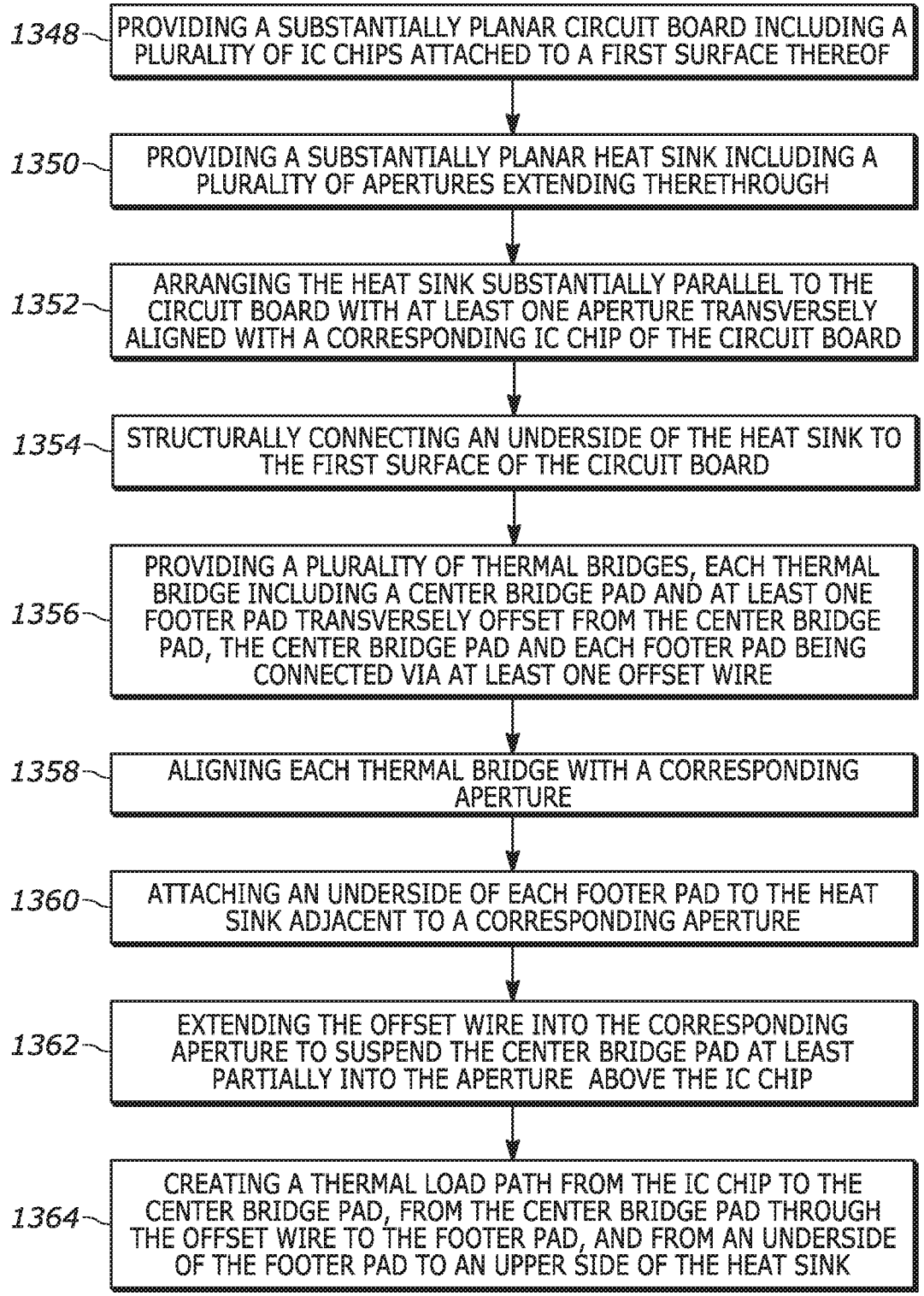
FIG. 13 is a flowchart of an example method including the example implementation of FIG. 2.

The flowchart of FIG. 13 shows an example sequence of a method for separating a thermal load path from a structural load path in a circuit board environment. In first action block 1348, a substantially planar circuit board 100 is provided, including a plurality of IC chips 108 attached to a first surface 218 thereof. Next, in second action block 1350, a substantially planar heat sink 214 including a plurality of apertures 216 extending therethrough is provided. The method then moves to third action block 1352, where the heat sink 214 is arranged substantially parallel to the circuit board 100 with at least one aperture 216 transversely aligned with a corresponding IC chip 108 of the circuit board 100. An underside 320 of the heat sink 214 may be structurally connected to the first surface 218 of the circuit board 100 in fourth action block 1354 in any desired manner, such as, but not limited to, adhesives, solder/brazing, rivets, any other scheme, or any combination thereof. However, it is also contemplated that some sliding could be permitted between at least portions of the heat sink 214 and the circuit board 100, and the structural connections could be configured accordingly. In the "mirrored" configuration previously mentioned, for example, an additional backing substrate (not shown) may be placed on top of the assembly 212 and attached to the heat sink 214, thus creating a "symmetric stack". With such a symmetric stack, the backing substrate(s) can be bonded using any desired scheme, such as an adhesive. The symmetric stack could also or instead be accomplished with a single backing substrate 110 and corresponding additional heat sink (not shown).

In fifth action block 1356, a plurality of thermal bridges 322 is provided, with each thermal bridge 322 including a center bridge pad 324 and at least one footer pad 326 transversely (and/or longitudinally and/or laterally) offset from the center bridge pad 324, with the center bridge pad 324 and each footer pad 326 being connected via at least one offset wire 328. The method then proceeds to sixth action block 1358, where each thermal bridge 322 is aligned with a corresponding aperture 216 and then, in seventh action block 1360, an underside 332 of each footer pad 326 is attached to the heat sink 214 adjacent to a corresponding aperture 216.

In eighth action block 1362, the offset wire 328 is extended into the corresponding aperture 216 to suspend the center bridge pad 324 at least partially into the aperture 216 above the IC chip 108. The center bridge pad 324 may also or instead be attached to the corresponding IC chip 108.

Finally, in ninth action block 1364, a thermal load path from the IC chip 108 to the center bridge pad 324, from the center bridge pad 324 through the offset wire 328 to the footer pad 326, and from an underside 332 of the footer pad 326 to an upper side 334 of the heat sink 214 is provided.

During assembly of a system 840, it is contemplated that the steps of at least some of the first through ninth action blocks 1348 through 1364 may be carried out, for example, with the circuit board 100 located on a tooling plate (not shown) with a top surface 218 of the circuit board 100 facing upward. Once assembly is completed as shown in FIG. 13, the completed circuit board 100 with corresponding apparatus 212 could be flipped over and placed on a carrier plate (not shown) for installation of one or more wedge locks 738, and/or storage and/or transport to a chassis 842 for installation.

As used herein, the singular forms "a," "an" and "the" can include the plural forms as well, unless the context clearly indicates otherwise. It will be further understood that the terms "comprises" and/or "comprising," as used herein, can specify the presence of stated features, steps, operations, elements, and/or components, but do not preclude the presence or addition of one or more other features, steps, operations, elements, components, and/or groups thereof.

As used herein, the term "and/or" can include any and all combinations of one or more of the associated listed items.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature might not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus, comprising:
    a substantially planar heat sink including a plurality of apertures extending therethrough, the heat sink being arranged substantially parallel to a substantially planar circuit board, the heat sink including at least one aperture transversely aligned with a corresponding IC chip of the circuit board, the IC chip being structurally supported by a first surface of the circuit board, and an underside of the heat sink being structurally connected to the first surface of the circuit board; and
    a plurality of thermal bridges, each thermal bridge including a center bridge pad and at least one footer pad transversely offset from the center bridge pad, the center bridge pad and each footer pad being connected via at least one offset wire, each thermal bridge being aligned with a corresponding aperture;
    wherein an underside of each footer pad is attached to the heat sink adjacent to a corresponding aperture, with the offset wire extending into the corresponding aperture to suspend the center bridge pad at least partially into the aperture above the IC chip, thus creating a thermal load path from the IC chip to the center bridge pad, from the center bridge pad through the offset wire to the footer pad, and from an underside of the footer pad to an upper side of the heat sink; and
    wherein the apparatus is configured to separate a thermal load path from a structural load path in a circuit board environment.

2. The apparatus of claim 1, wherein each thermal bridge includes a center bridge pad interposed between two linearly spaced aligned footer pads.

3. The apparatus of claim 2, wherein a plurality of offset wires connect each footer pad to the center bridge pad.

4. The apparatus of claim 1, wherein the offset wire has a labyrinthine configuration.

5. The apparatus of claim 1, wherein the offset wire is configured to mechanically dissipate thermal expansion dimensional mismatches between at least two of the circuit board, the IC chip, the thermal bridge, and the heat sink.

6. The apparatus of claim 1, wherein at least one of the heat sink, the footer pad, the center bridge pad, and the offset wire is at least partially made of copper.

7. The apparatus of claim 1, wherein an underside of the center bridge pad is in direct contact with the IC chip.

8. The apparatus of claim 1, wherein an entirety of the center bridge pad is recessed into the aperture, below the upper side of the heat sink.

9. A method for separating a thermal load path from a structural load path in a circuit board environment, the method comprising:
    providing a substantially planar circuit board including a plurality of IC chips attached to a first surface thereof;
    providing a substantially planar heat sink including a plurality of apertures extending therethrough;
    arranging the heat sink substantially parallel to the circuit board with at least one aperture transversely aligned with a corresponding IC chip of the circuit board;
    structurally connecting an underside of the heat sink to the first surface of the circuit board;
    providing a plurality of thermal bridges, each thermal bridge including a center bridge pad and at least one footer pad transversely offset from the center bridge pad, the center bridge pad and each footer pad being connected via at least one offset wire;
    aligning each thermal bridge with a corresponding aperture;
    attaching an underside of each footer pad to the heat sink adjacent to a corresponding aperture;
    extending the offset wire into the corresponding aperture to suspend the center bridge pad at least partially into the aperture above the IC chip; and
    creating a thermal load path from the IC chip to the center bridge pad, from the center bridge pad through the offset wire to the footer pad, and from an underside of the footer pad to an upper side of the heat sink.

10. The method of claim 9, including mechanically dissipating thermal expansion dimensional mismatches between at least two of the circuit board, the IC chip, the thermal bridge, and the heat sink via the offset wire.

11. The method of claim 9, including placing an underside of the center bridge pad in direct contact with the IC chip.

12. The method of claim 9, including recessing an entirety of the center bridge pad into the aperture, below the upper side of the heat sink.

13. A circuit board system, comprising:
    at least one substantially planar circuit board including a plurality of IC chips attached to a first surface thereof;
    a chassis including a plurality of mutually parallel board-accepting slots arranged in a transverse stack; and
    at least one apparatus including
        a substantially planar heat sink including a plurality of apertures extending therethrough, the heat sink being arranged substantially parallel to the circuit board with at least one aperture transversely aligned with a corresponding IC chip of the circuit board and an underside of the heat sink being structurally connected to the first surface of the circuit board, and
        a plurality of thermal bridges, each thermal bridge including a center bridge pad and at least one footer pad transversely offset from the center bridge pad, the center bridge pad and each footer pad being connected via at least one offset wire, each thermal bridge being aligned with a corresponding aperture;
    wherein an underside of each footer pad is attached to the heat sink adjacent to a corresponding aperture, with the offset wire extending into the corresponding aperture to suspend the center bridge pad at least partially into the aperture above the IC chip, thus creating a thermal load path from the IC chip to the center bridge pad, from the center bridge pad through the offset wire to the footer pad, and from an underside of the footer pad to an upper side of the heat sink;
    wherein each circuit board and corresponding apparatus are associated with a selected board-accepting slot; and
    wherein the thermal load path is separated from the structural load path of the system.

14. The system of claim 13, wherein the offset wire is configured to mechanically dissipate thermal expansion dimensional mismatches between at least two of the circuit board, the IC chip, the thermal bridge, and the heat sink.

15. The system of claim 13, wherein at least one wedge lock is interposed transversely between the selected board-accepting slot and at least one of the circuit board and corresponding apparatus.

16. The system of claim 15, wherein the at least one wedge lock is in direct transverse contact with the board-accepting slot and with a corresponding heat sink.

17. The system of claim 13, wherein the chassis includes at least one transversely extending access slot therein, each access slot allowing access between at least one board-accepting slot and an ambient space outside the chassis.

* * * * *